United States Patent
Wang

(10) Patent No.: US 10,209,595 B2
(45) Date of Patent: Feb. 19, 2019

(54) ARRAY SUBSTRATE AND MANUFACTURING METHOD THEREFOR, AND DISPLAY PANEL

(71) Applicants: BOE TECHNOLOGY GROUP CO., LTD., Beijing (CN); BEIJING BOE DISPLAY TECHNOLOGY CO., LTD., Beijing (CN)

(72) Inventor: Xiao Wang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/514,366

(22) PCT Filed: Mar. 16, 2016

(86) PCT No.: PCT/CN2016/076470
§ 371 (c)(1),
(2) Date: Mar. 24, 2017

(87) PCT Pub. No.: WO2016/165517
PCT Pub. Date: Oct. 20, 2016

(65) Prior Publication Data
US 2017/0285381 A1    Oct. 5, 2017

(30) Foreign Application Priority Data

Apr. 14, 2015    (CN) .......................... 2015 1 0176672

(51) Int. Cl.
*G02F 1/1368*    (2006.01)
*H01L 21/77*    (2017.01)
(Continued)

(52) U.S. Cl.
CPC ...... *G02F 1/1368* (2013.01); *G02F 1/134309* (2013.01); *G02F 1/134363* (2013.01);
(Continued)

(58) Field of Classification Search
CPC .......... G02F 2001/136218; G02F 2001/13606; G02F 1/1368
See application file for complete search history.

(56) References Cited

U.S. PATENT DOCUMENTS 9,086,601 B2    7/2015    Jeong et al.
2006/0186913 A1    8/2006    Kim
(Continued)

FOREIGN PATENT DOCUMENTS

CN    1825176 A    8/2006
CN    103676374 A    3/2014
(Continued)

OTHER PUBLICATIONS

International Search Report and Written Opinion dated Jun. 1, 2016; PCT/CN2016/076470.
(Continued)

*Primary Examiner* — Asok K Sarkar
*Assistant Examiner* — Grant Withers
(74) *Attorney, Agent, or Firm* — Ladas & Parry LLP

(57) ABSTRACT

Provided are an array substrate and a manufacturing method therefor, and a display panel. The array substrate comprises: a base substrate; a data line and a passivation layer which are formed on the base substrate; a common electrode layer formed on the passivation layer; and a shielding electrode layer and a barrier layer which are formed on the base substrate, wherein the shielding electrode layer is arranged between the data line and the passivation layer, the barrier layer is arranged between the data line and the shielding electrode layer, the shielding electrode layer is grounded,
(Continued)

and the barrier layer is made of a material with an insulation function.

9 Claims, 2 Drawing Sheets

(51) Int. Cl.
    *G02F 1/1343*     (2006.01)
    *G02F 1/1362*     (2006.01)
    *G02F 1/136*     (2006.01)
    *H01L 27/12*     (2006.01)

(52) U.S. Cl.
    CPC ........ G02F 1/136286 (2013.01); H01L 21/77 (2013.01); *G02F 2001/13606* (2013.01); *G02F 2001/13629* (2013.01); *G02F 2001/134372* (2013.01); *G02F 2001/136218* (2013.01); *G02F 2001/136295* (2013.01); *G02F 2201/121* (2013.01); *G02F 2201/123* (2013.01); *G02F 2202/10* (2013.01); *H01L 27/124* (2013.01)

(56) References Cited

U.S. PATENT DOCUMENTS

| | | | |
|---|---|---|---|
| 2010/0176381 A1* | 7/2010 | Yagi | G02F 1/1368 257/40 |
| 2011/0073868 A1* | 3/2011 | Nakagawa | H01L 27/1214 257/72 |
| 2013/0057813 A1 | 3/2013 | Jeong et al. | |
| 2014/0375534 A1* | 12/2014 | Lee | G09G 3/3648 345/87 |
| 2015/0160489 A1 | 6/2015 | Kim et al. | |
| 2016/0011466 A1 | 1/2016 | Choi | |
| 2016/0056177 A1* | 2/2016 | Li | H01L 27/124 257/72 |

FOREIGN PATENT DOCUMENTS

| | | |
|---|---|---|
| CN | 104238207 A | 12/2014 |
| CN | 104698705 A | 6/2015 |
| CN | 104793416 A | 7/2015 |

OTHER PUBLICATIONS

First Chinese Office Action dated Mar. 28, 2017; Appln. No. 201510176672.2.

The Second Chinese Office Action dated Jul. 24, 2017; Appln. No. 201510176672.2.

* cited by examiner

ARRAY SUBSTRATE AND MANUFACTURING METHOD THEREFOR, AND DISPLAY PANEL

TECHNICAL FIELD

Embodiments of the present disclosure relate to an array substrate and a manufacturing method thereof, and a display panel.

BACKGROUND

A multidimensional electric field display mode is a common display mode of a liquid crystal display panel. Based on an inherent structure limitation of the multidimensional electric field display mode, a process flow of an exemplary multidimensional electric field display mode display panel mainly includes manufacturing: a gate line→an active layer→a data line→a first layer of Indium tin oxide (ITO in short)→a passivation layer→a second layer of ITO, wherein, the first layer of ITO is a pixel electrode layer, and the second layer of ITO is a common electrode layer; and, the common electrode layer covers the data line.

In this way, because other non-conductive film layers can also be presented between the common electrode layer and the data line, a large parasitic capacitance can be generated between the common electrode layer and the data line, and signal delay is generated; even further, a problem of an too green image can happen to a picture displayed on a screen, and display quality of the picture is seriously affected.

SUMMARY

Embodiments of the present disclosure relate to an array substrate and a manufacturing method thereof, and a display panel. Problems that the parasitic capacitance between the data line and the common electrode layer in a structure of the array substrate is too large and an over green image is displayed are solved, signal delay is avoided, and display quality of a picture of a display device is improved.

On a first aspect, an array substrate is provided. The array substrate includes: a base substrate; a data line and a passivation layer, formed on the base substrate; a common electrode layer, formed on the passivation layer; a shielding electrode layer and a barrier layer, formed on the base substrate, wherein, the shielding electrode layer is arranged between the data line and the passivation layer, the barrier layer is arranged between the data line and the shielding electrode layer, the shielding electrode layer is configured to be grounded, and a material of the barrier layer is a insulating material.

On a second aspect, a manufacturing method of an array substrate is provided. The method includes: forming a data line and a passivation layer on a base substrate; forming a common electrode layer on the passivation layer; forming a shielding electrode layer between the data line and the passivation layer; forming a first barrier layer between the data line and the shielding electrode layer; wherein, the shielding electrode layer is configured to be grounded, and a material of the first barrier layer is a insulating material.

On a third aspect, a display panel is provided. The display panel includes the array substrate according to the first aspect.

BRIEF DESCRIPTION OF THE DRAWINGS

In order to clearly illustrate technical solutions of the embodiments of the disclosure or in the prior art, drawings needing to be used in the embodiments or in the prior art will be introduced simply, and it is obvious that the described drawings are just some of the embodiments of the present disclosure, and those skilled in the art can also obtain other drawings according to the drawings, without any inventive work.

DETAILED DESCRIPTION

The technical solutions of the embodiments of the present disclosure will be described in a clearly and fully understandable way in connection with the drawings in the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Figure 1:
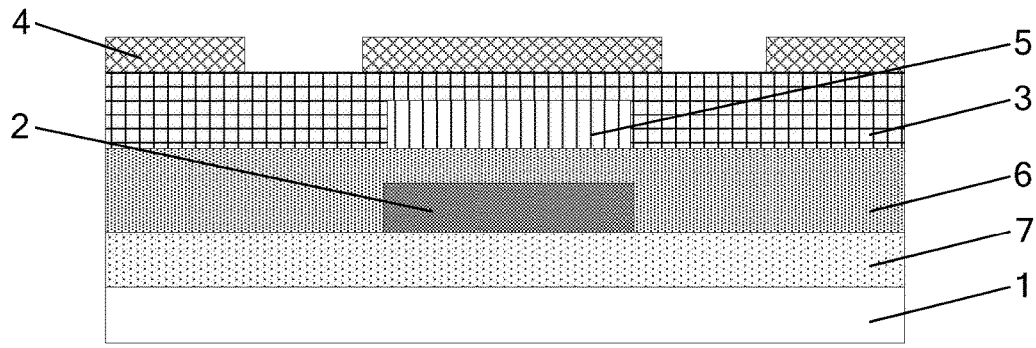
FIG. 1 is a structural schematic diagram of an array substrate provided by an embodiment of the present disclosure.

An embodiment of the present disclosure provides an array substrate, as shown in FIG. 1, the array substrate includes a base substrate 1, a data line 2 and a passivation layer 3 formed on the base substrate 1, and a common electrode layer 4 formed on the passivation layer 3, the array substrate further includes a shielding electrode layer 5 and a barrier layer 6, wherein:

The shielding electrode layer 5 is arranged between the data line 2 and the passivation layer 3.

The barrier layer 6 is arranged between the data line 2 and the shielding electrode layer 5.

The shielding electrode layer 5 is configured to be grounded; and a material of the barrier layer 6 is an insulating material.

A thickness of the barrier layer can be 1000-6000 Å.

As shown in FIG. 1, the array substrate further includes a gate insulating layer 7. The gate insulating layer 7 can be formed by using a chemical vapor deposition method. A material of the gate insulating layer can be silicon nitride and the like, and a thickness of the gate insulating layer can be 3600-4400 Å; a material of the passivation layer 3 can be silicon nitride or a transparent organic resin material, and a thickness of the passivation layer can be 1000-6000 Å; a material of the common electrode layer 4 can be Indium Tin Oxide (ITO) or indium-doped zinc oxide (IZO), the common electrode layer can be formed by using a magnetron sputtering method, and a thickness of the common electrode layer can be 300-500 Å.

Exemplarily, the barrier layer is formed on the data line in the embodiment, meanwhile, the shielding electrode layer is formed between the barrier layer and the passivation layer; in this way, the barrier layer is arranged between the data line and the shielding electrode layer of the finally formed array substrate, and the passivation layer is arranged between the shielding electrode layer and the common electrode layer; because the shielding electrode layer is configured to be grounded, the shielding electrode layer is equivalent to a shielding electrode is this case, and can lead out a generated excessive parasitic capacitance through a grounding line of the shielding electrode layer. Compared with that only the passivation layer is arranged between the data line and the common electrode layer, a parasitic capacitance generated between the data line and the common electrode layer can be greatly reduced, and a problem that an over green image is displayed is avoided.

According to the array substrate provided by the embodiment of the present disclosure, by arranging the barrier layer on the data line of the array substrate and arranging the shielding electrode layer between the barrier layer and the common electrode layer, in this way, the barrier layer presents between the shielding electrode layer and the data line, the passivation layer presents between the shielding electrode layer and the common electrode layer, and the shielding electrode layer is configured to be grounded. Therefore, the excessive parasitic capacitance generated between the common electrode layer and the data line can be led out through the grounding line of the shielding electrode layer, and influences of the parasitic capacitance can be greatly reduced, which solves problems that the parasitic capacitance between the data line and the common electrode layer in a structure of the array substrate is too large and an over green image is displayed, avoids signal delay, and improves display quality of a picture of a display device.

Exemplarily, referring to FIG. 2, the array substrate further includes a pixel electrode layer 8 formed below the passivation layer 3, wherein, the shielding electrode layer 5 and the pixel electrode layer 8 are formed in a same layer.

A material of the shielding electrode layer 5 and a material of the pixel electrode layer 8 are same.

Figure 2:
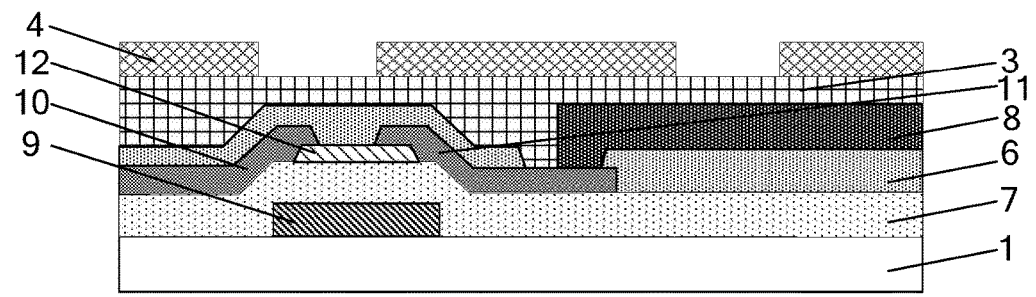
FIG. 2 is a structural schematic diagram of another array substrate provided by an embodiment of the present disclosure.

Further, as shown in FIG. 2, the array substrate further includes a thin film transistor, and the thin film transistor includes a gate electrode 9, a gate insulating layer 7, a source electrode 10, a drain electrode 11 and an active layer 12, wherein:

The barrier layer 6 is further arranged on the thin film transistor and covers the active layer 12 of the thin film transistor.

The source electrode and the drain electrode can be formed by using a magnetron sputtering method, a material of the source electrode and a material of the drain electrode can both be molybdenum (Mo), aluminum (Al) or copper (Cu) or other metal materials and can also be a combined structure of thin films of the above materials; thicknesses of the source electrode and the drain electrode can be 2200-4000 Å, and the source electrode and the drain electrode can be formed by using the magnetron sputtering method; a material of the active layer can be amorphous silicon, a thickness of the active layer can be 1800-2300 Å'; and the material of the pixel electrode layer can be ITO or IZO, the pixel electrode layer can be formed through a magnetron sputtering method, and a thickness of the pixel electrode layer can be 300-500 Å.

A material of the barrier layer can include: silicon nitride, silicon oxynitride, silicon oxide or an organic film or the like.

Exemplarily, the barrier layer is arranged between the data metal layer and the pixel electrode layer in the embodiment, in this way, the barrier layer is formed before the pixel electrode layer, when the pixel electrode layer is patterned. Influences of etching liquid or etching gas on the formed thin film transistor can be avoided whether the barrier layer is etched by using a dry etching method or a wet etching method, and performance of the thin film transistor is guaranteed.

A thickness of the shielding electrode layer 5 can be 300-700 Å. A material of the shielding electrode layer can be a material same as the material of the pixel electrode layer, for example: ITO or IZO. It is noted that, the shielding electrode layer in the embodiment and the pixel electrode layer can adopt a same material, and are formed by a same patterning process, and therefore a manufacturing process can be reduced, and production cost is reduced.

Exemplarily, the thickness of the barrier layer can be 2000 Å; in this way, in addition to that the barrier layer can stop influences of patterning of the pixel electrode layer on channels of the thin film transistor, it can be avoided that a thickness of a formed display panel is too large, the production cost is reduced, and a lightening and thinning trend of a display device is achieved.

It is noted that, the array substrate provided in the embodiment of the present disclosure can be applicable to a high-aperture-ratio display device of advanced super dimension Switch (ADS) mode, HADS mode.

According to the array substrate provided by the embodiment of the present disclosure, by arranging the barrier layer on the data line of the array substrate and arranging the shielding electrode layer between the barrier layer and the common electrode layer, in this way, the barrier layer presents between the shielding electrode layer and the data line, the passivation layer presents between the shielding electrode layer and the common electrode layer and the shielding electrode layer is configured to be grounded, so that an excessive parasitic capacitance generated between the common electrode layer and the data line can be led out through a grounding line of the shielding electrode layer, and influences of the parasitic capacitance can be greatly reduced, which solves problems that the parasitic capacitance between the data line and the common electrode layer in a structure of the array substrate is too large and an over green image, avoids signal delay, and improves display quality of a picture of a display device.

Figure 3:
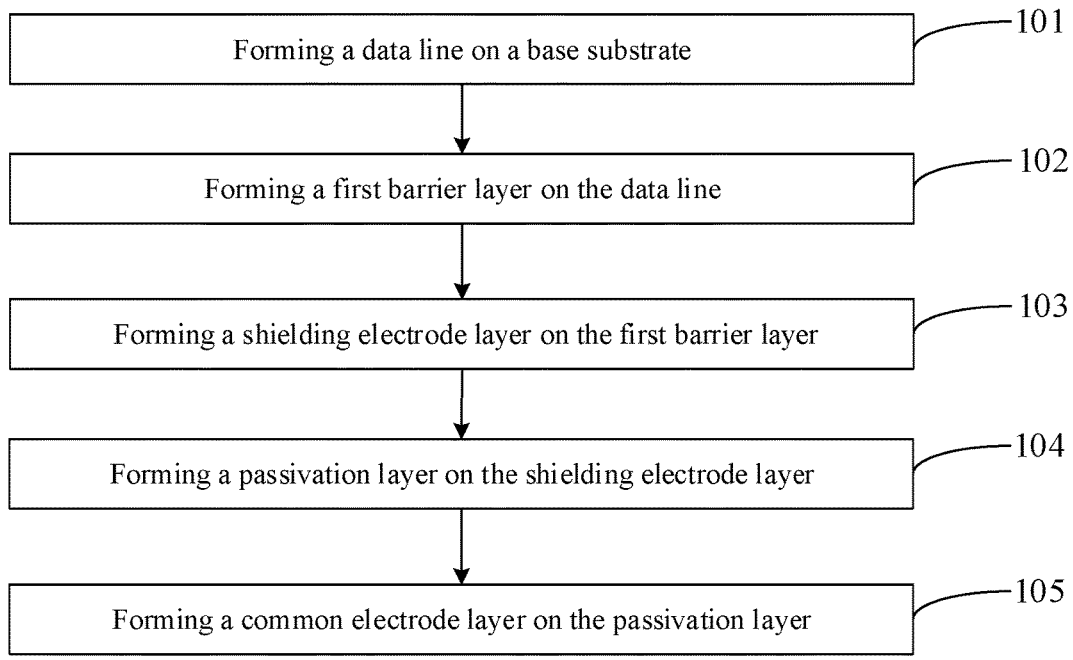
FIG. 3 is a flow diagram of a manufacturing method of an array substrate provided by an embodiment of the present disclosure.

An embodiment of the present disclosure provides a manufacturing method of an array substrate; referring to FIG. 3, the method includes steps of:

101: forming a data line on a base substrate.

Exemplarily, a layer of metal thin film with a thickness ranging from 1000 Å to 7000 Å can be deposited on the substrate such as a glass substrate or a quartz substrate by using a magnetron sputtering method. The data line is formed in a certain region by a patterning process treatment.

102: forming a first barrier layer on the data line.

Exemplarily, a first barrier layer thin film with a thickness ranging from 1000 Å to 6000 Å can be deposited on the data line by using a chemical vapor deposition method or a magnetron sputtering method; a material of the first barrier layer thin film can be a insulating material, such as silicon nitride, and silicon oxide or silicon oxynitride or the like can also be used.

103: forming a shielding electrode layer on the first barrier layer.

Exemplarily, a transparent conductive material such as ITO or IZO or the like is deposited on the first barrier layer by using a magnetron sputtering method, and then the shielding electrode layer is formed by exposure, development and etching.

104: forming a passivation layer on the shielding electrode layer.

Exemplarily, by using a method similar with methods of a gate insulating layer and an active layer, the passivation layer with a thickness ranging from 1000 Å to 6000 Å is coated on the whole substrate and the material thereof can be silicon nitride or a transparent organic resin material.

105: forming a common electrode layer on the passivation layer.

Exemplarily, a layer of transparent conductive material with a thickness ranging from 300 Å to 500 Å is deposited by using a magnetron sputtering method, such as ITO or IZO or the like, and then the common electrode layer is formed by exposure, development and etching.

According to the manufacturing method of the array substrate provided by the embodiment of the present disclosure, by forming the barrier layer on the data line of the array substrate and forming the shielding electrode layer between the barrier layer and the common electrode layer, in this way, the barrier layer presents between the shielding electrode layer and the data line, the passivation layer presents between the shielding electrode layer and the common electrode layer and the shielding electrode layer is configured to be grounded, so that an excessive parasitic capacitance generated between the common electrode layer and the data line can be led out through a grounding line of the shielding electrode layer, and influences of the parasitic capacitance can be greatly reduced, which solves problems that the parasitic capacitance between the data line and the common electrode layer in a structure of the array substrate is too large and an over green image, avoids signal delay, and improves display quality of a picture of a display device.

Figure 4:
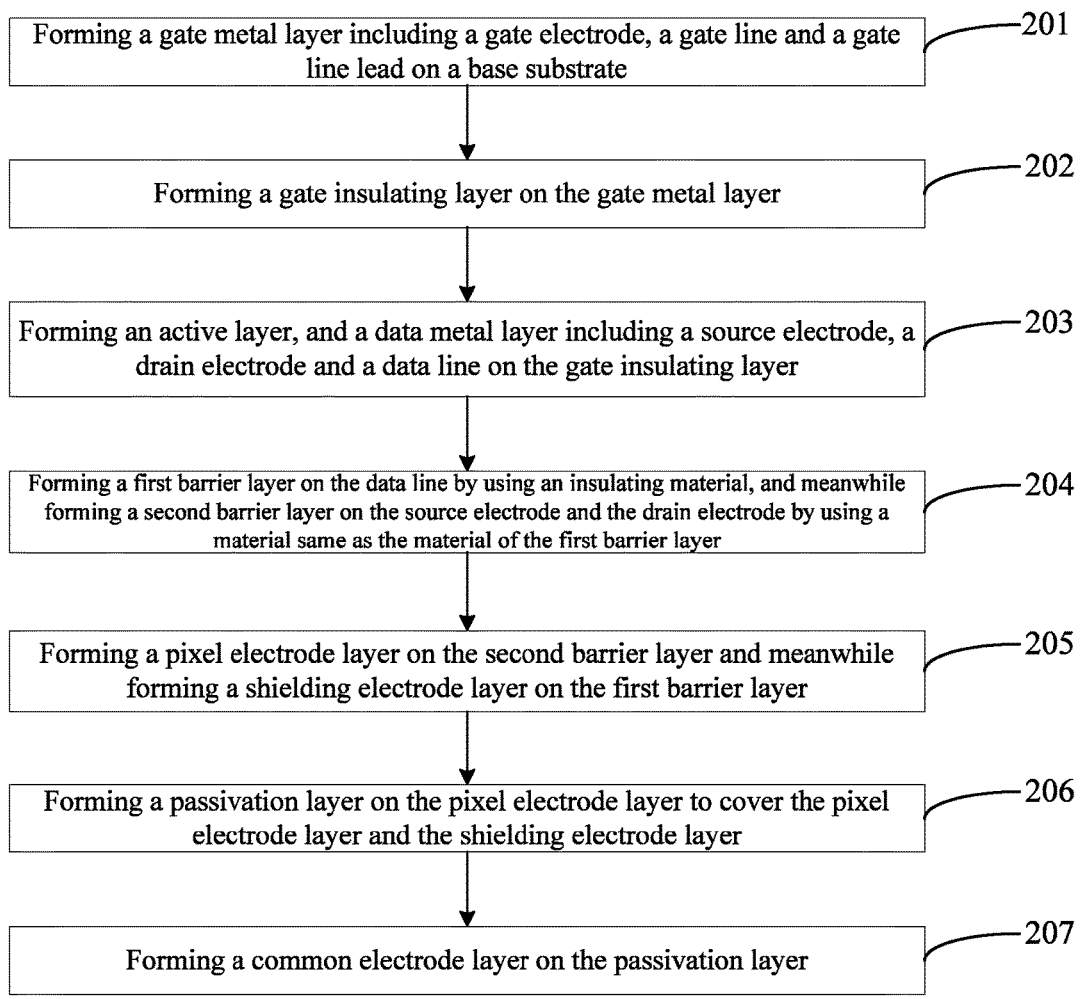
FIG. 4 is a flow diagram of another manufacturing method of an array substrate provided by an embodiment of the present disclosure.

An embodiment of the present disclosure provides a manufacturing method of an array substrate; referring to FIG. 4, the method includes steps of:

201: forming a gate metal layer including a gate electrode, a gate line and a gate line lead on a base substrate.

Exemplarily, a layer of metal thin film with a thickness ranging from 1000 Å to 7000 Å can be deposited on the substrate such as a glass substrate or a quartz substrate by using a magnetron sputtering method. Generally, the metal thin film can adopt molybdenum, aluminum, an aluminum-nickel alloy, a molybdenum-tungsten alloy, chromium, or copper or other metal, and a combined structure of thin films of the above materials can also be used. Then, a mask is used to form the gate metal layer in a certain region of the substrate by exposure, development, etching, and peeling and other patterning process treatment.

202: forming a gate insulating layer on the gate metal layer.

Exemplarily, a gate insulating layer thin film with a thickness ranging from 1000 Å to 6000 Å can be deposited on the glass substrate with the gate metal layer formed thereon by using a chemical vapor deposition method or a magnetron sputtering method; a material of the gate insulating layer thin film can be silicon nitride, and silicon oxide, silicon oxynitride and the like can also be used.

203: forming an active layer, a source electrode, a drain electrode and a data line on the gate insulating layer.

Exemplarily, a metal oxide semiconductor thin film can be deposited on the gate insulating layer by using a chemical vapor deposition method, then a patterning process is performed on the metal oxide semiconductor thin film to form the active layer, and that is to say, after coating photoresist, it is only required that an ordinary mask to perform exposure, development and etching on the substrate to form the active layer.

204: forming a first barrier layer on the data line by using a insulating material, and meanwhile forming a second barrier layer on the source electrode and the drain electrode by using a material same as the material of the first barrier layer.

Wherein, the material of the first barrier layer and the material of the second barrier layer can both include: silicon nitride, silicon oxynitride, silicon oxide, or organic film or the like; and for example, thicknesses of the first barrier layer and the second barrier layer can be 2000 Å.

205: forming a pixel electrode layer on the second barrier layer and meanwhile forming a shielding electrode layer on the first barrier layer.

Exemplarily, a layer of transparent conductive material, such as ITO or IZO or the like, with a thickness ranging from 300 Å to 500 Å can he deposited on the first barrier layer and the second barrier layer by using a magnetron sputtering method, then, by exposure, development and etching, the shielding electrode on the first barrier layer and the pixel electrode layer on the second barrier layer are formed.

206: forming a passivation layer on the pixel electrode layer to cover the pixel electrode layer and the shielding electrode layer.

207: forming a common electrode layer on the passivation layer.

It is noted that, in the process of this embodiment, the steps as same as the above embodiment is similar with illustration in the above embodiment, and will not be repeated herein.

According to the manufacturing method of the array substrate provided by the embodiment of the present disclosure, by forming the barrier layer on the data line of the array substrate and forming the shielding electrode layer between the barrier layer and the common electrode layer, in this way, the barrier layer can present between the shielding electrode layer and the data line, the passivation layer can present between the shielding electrode layer, and the common electrode layer and the shielding electrode layer is configured to be grounded, so that an excessive parasitic capacitance generated between the common electrode layer and the data line can be led out through a grounding line of the shielding electrode layer, and influences of the parasitic capacitance can be greatly reduced, which solves problems that the parasitic capacitance between the data line and the common electrode layer in a structure of the array substrate is too large and an over green image is displayed, avoids signal delay, and improves display quality of a picture of a display device. Further, performance of a thin film transistor can be improved.

An embodiment of the present disclosure provides a display panel, and the display panel includes the array substrate provided in the embodiment of the present disclosure.

According to the display panel provided by the embodiment of the present disclosure, by forming a barrier layer on a data line of the array substrate of the display panel and forming a shielding electrode layer between the barrier layer and a common electrode layer, in this way, the barrier layer can present between the shielding electrode layer and the data line, a passivation layer can be arranged between the shielding electrode layer and the common electrode layer, and the shielding electrode layer is configured to be grounded, so that an excessive parasitic capacitance generated between the common electrode layer and the data line can be led out through a grounding line of the shielding electrode layer, and influences of the parasitic capacitance can be greatly reduced, which solves problems that the parasitic capacitance between the data line and the common electrode layer in a structure of the array substrate is too large and an over green image is displayed, avoids signal delay, and improves display quality of a picture of a display device. Further, performance of a thin film transistor can be improved, and display performance of the display panel can be improved.

What are described above are only specific embodiments of the present disclosure, and the protection scope of the present disclosure is not limited thereto. It shall easily occur to one person skilled in the art within the technical scope of the disclosure of the present disclosure that various changes or replacements shall be covered within the scope of the present disclosure. Therefore, the scope of the present disclosure should be the scope of the following claims.

The present application claims priority of Chinese Patent Application No. 201510176672.2 filed on Apr. 14, 2015, the disclosure of which is incorporated herein by reference in its entirety as part of the present application.

The invention claimed is:

1. An array substrate, comprising:
a base substrate;
a data line and a passivation layer, formed on the base substrate;
a common electrode layer, formed on the passivation layer;
a shielding electrode layer and a first barrier layer, formed on the base substrate,
wherein, the shielding electrode layer is arranged between the data line and the passivation layer,
the first barrier layer is arranged between the data line and the shielding electrode layer,
the shielding electrode layer is configured to be grounded, and a material of the barrier layer is an insulating material,
wherein, the array substrate further comprises a pixel electrode layer formed below the passivation layer, and the shielding electrode layer and the pixel electrode layer are formed in a same layer,
wherein, the array substrate further comprises a thin film transistor formed on the base substrate, and a second barrier layer on the thin film transistor and covering an active layer of the thin film transistor;
wherein, the first barrier layer is formed of a material and the second barrier layer is formed of the same material as the material which the first barrier layer is formed of, and both the barrier layer and the second barrier layer are formed in the same layer.

2. The array substrate according to claim 1, wherein, the shielding electrode layer and the pixel electrode layer are formed of the same material.

3. The array substrate according to claim 1, wherein, the material of the first barrier layer includes: silicon nitride, silicon oxynitride, silicon oxide or an organic film.

4. The array substrate according to claim 1, wherein, a thickness of the first barrier layer is 1000-6000 Å.

5. The array substrate according to claim 4, wherein, the thickness of the first barrier layer is 2000 Å.

6. The array substrate according to claim 1, wherein, a thickness of the shielding electrode layer is 300-700 Å.

7. A display panel, wherein, the display panel comprises the array substrate according to claim 1.

8. A manufacturing method of an array substrate, comprising:
forming a data line and a passivation layer on a base substrate;
forming a common electrode layer on the passivation layer;
forming a shielding electrode layer between the data line and the passivation layer;
forming a first barrier layer between the data line and the shielding electrode layer;
wherein, the shielding electrode layer is configured to be grounded, and a material of the first barrier layer is an insulating material,
the method further comprising;
forming a pixel electrode layer below the passivation layer;
forming the shielding electrode layer on the data line includes:
forming the shielding electrode layer on the data line and in a same layer with the pixel electrode layer, by using a material which is the same as that of the pixel electrode layer,
the method further comprising;
forming a thin film transistor on the base substrate;
forming a second barrier layer on the thin film transistor and covering an active layer of the thin film transistor;
wherein, the first barrier layer is formed of a material and the second barrier layer is formed of the same material as the material which the first barrier layer is formed of, and both the barrier layer and the second barrier layer are formed in the same layer.

9. The method according to claim 8, wherein, the material of the first barrier layer includes: silicon nitride, silicon oxynitride, silicon oxide or an organic film.

* * * * *